Dec. 8, 1959 F. J. LUNDBURG 2,916,615

RADIO FREQUENCY DELAY LINE

Filed May 3, 1957 2 Sheets-Sheet 1

Inventor
FRANK J. LUNDBURG

By [signature]
Attorney

Dec. 8, 1959 F. J. LUNDBURG 2,916,615

RADIO FREQUENCY DELAY LINE

Filed May 3, 1957 2 Sheets-Sheet 2

Inventor
FRANK J. LUNDBURG
By Percy P. Lantzy
Attorney

United States Patent Office 2,916,615
Patented Dec. 8, 1959

2,916,615

RADIO FREQUENCY DELAY LINE

Frank J. Lundburg, East Orange, N.J., assignor to International Telephone and Telegraph Corporation, Nutley, N.J., a corporation of Maryland Application May 3, 1957, Serial No. 656,984

4 Claims. (Cl. 250—15)

This invention relates to delay lines and more particularly to radio frequency (RF) delay lines made of superconductive materials.

There are certain radio equipments which are capable of receiving radio pulses and retransmitting these same pulses after a specific time delay has been introduced therein. However, these equipments require expensive and space consuming electronic components to generate the time delay and introduce it into the radio pulses. In a typical case these components comprise two mixers, a local oscillator and a quartz delay line. These are necessary because in the state of the art today artificial lines or delay lines are not efficiently operative beyond 40 megacycles. It is necessary, therefore, to beat down the RF pulses to the 30–40 megacycle range of an IF amplifier, feed them into the delay line in that frequency range and then restore them to the original frequencies for retransmitting.

It is, therefore, an object of this invention to provide a radio frequency delay line which is capable of operating at frequencies up to 100,000 megacycles.

It is a further object to provide a radio device which will receive the RF pulse, inject the requisite delay therein and then retransmit the time delayed original RF pulse at the same frequency.

A feature of this invention is a delay line of extremely low attenuation comprising conductors arranged to provide distributed inductances and capacitances therealong, the conductors being of superconductive material, and means to maintain the delay line at a temperature below the superconductivity transition temperature of the conductors to reduce the attenuation thereof to a minimum value.

Another feature is a delay line of the reflection type whereby pulses from the receiver are injected into the delay line, travel to and fro therealong during the delay time and are then switched off to the transmitter to be retransmitted.

Still another feature is the use of a magnetic field applied to the delay line of the reflection type which is used to erase any residual pulses that may have remained in the delay line after the delayed pulses have been switched out to the transmitter.

These and other objects and features of the present invention will become apparent and the foregoing will be better understood with reference to the following description of the embodiments thereof, reference being had to the drawings, in which.

It is well known that certain materials exhibit the property of superconductivity at low temperatures. The electrical resistance of mercury drops suddenly to zero at 4.12° K., niobium becomes a superconductor at 8° K., lead at 7.2° K., vanadium at 5.1° K., tantalum at 4.4° K., tin at 3.7° K., aluminum at 1.2° K. and titanium at 0.5° K. In addition to twenty-one elements, many alloys and compounds are superconductors with transition temperatures varying between zero degrees and 17° K. The resistivity of any superconductive material is relatively high at room temperature, especially those which have high transition temperatures such as niobium, lead, tantalum, etc. It is to be noted that relatively poor conductors become superconductors at low temperatures whereas good conductors such as gold, silver and copper do not. The resistivity of superconductors drops as they are cooled. Just above their superconductive transition, the resistivity is between $10^{-1}$ and $10^{-3}$ of their room temperature resistivity, depending on the purity and mechanical strain in a particular sample.

Figure 1:
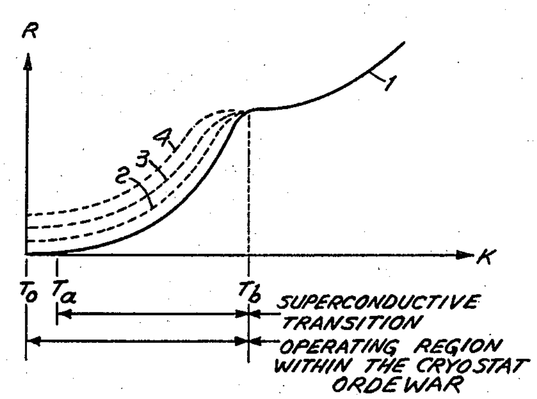
Fig. 1 is a graph of resistance vs. temperature of superconductive materials.
Figure 2:
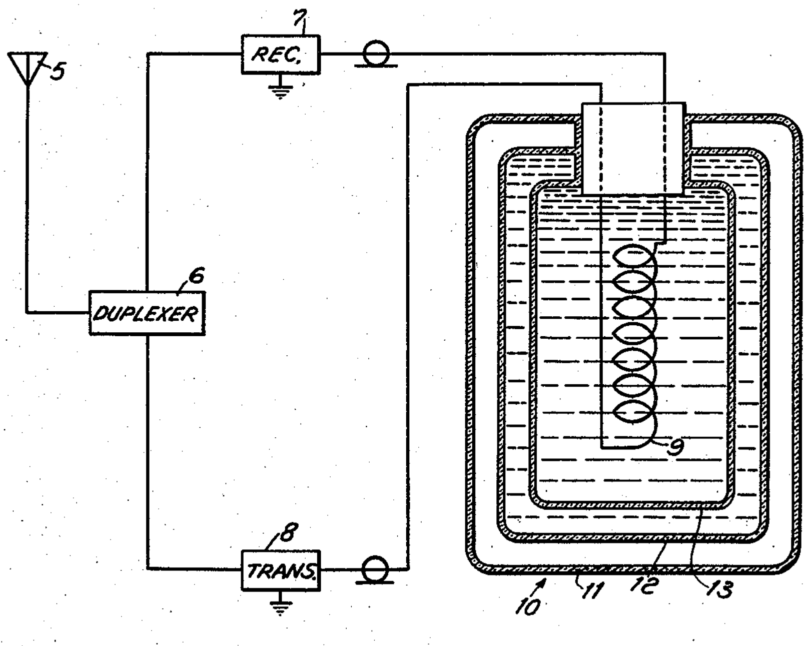
Fig. 2 is a block diagram of one embodiment of this invention.

Below the superconductivity transition, the resistivity is exactly zero. However, this zero resistivity is D.C. resistance. Where alternating current is present, then the resistivity does not fall to zero but to a small quantity above zero. Fig. 1 shows the resistance versus temperature curve of a typical superconductive material. The solid line 1 shows the decreasing resistance of the material with decreasing temperature. When the temperature falls to $T_b$, known as the transition temperature, a sharp drop occurs in the resistance and continues until the temperature falls to $T_a$, when the D.C. resistance becomes zero. The range between $T_b$ and $T_a$ is known as the superconductive transition. However, if instead of D.C. there is present an A.C. current, then the curve would follow the dotted lines 2, 3 and 4 depending on the frequency of the current with curve 4 being relatively the highest frequency.

Another factor that tends to influence the resistivity of superconductive materials is a magnetic field. Conductors exhibiting superconductive transition points lose this property when a magnetic field of a critical value is applied above which value the resistance reads to normal. Therefore, with the temperature held consistent it is possible to shift the resistance of the superconductive material from its superconductive state to the normal resistance state and back as a magnetic field is applied and removed.

Referring to Fig. 1 there is shown an antenna 5 adapted to both receive and transmit radar pulses and a duplexer 6 coupling the antenna 5 to a radio receiver 7 and a transmitter 8. A delay line 9 of the coaxial line type is disposed within a cryostat 10, or a Dewar flask, and couples the receiver 7 to the transmitter 8. The cryostat 10 is constructed with an outer wall 11, a first inner wall 12 and a second inner wall 13. The space between walls 11 and 12 is evacuated. Liquid nitrogen fills the space between walls 12 and 13 and the inside compartment is filled with liquid helium. The delay line 9 is composed of superconductive material and is of sufficient length and possesses the desired characteristics to provide the required delay time to the received radar pulses. The delay line 9 is held in the superconductive state within the cryostat. Therefore, the radar pulse as it passes through the delay line 9 to the transmitter 8 undergoes a very low attenuation, since the electrical resistance of the delay line in the superconductive state is almost zero. From the transmitter 8 the delayed pulse is transmitted out at the same frequency as received. It is to be understood that the delay line may be of any other type or shape as may be required so long as it is formed of superconductive material and the cryostat may be of any other shape, configuration or structure so long as the required low temperature can be secured therein.

Figure 3:
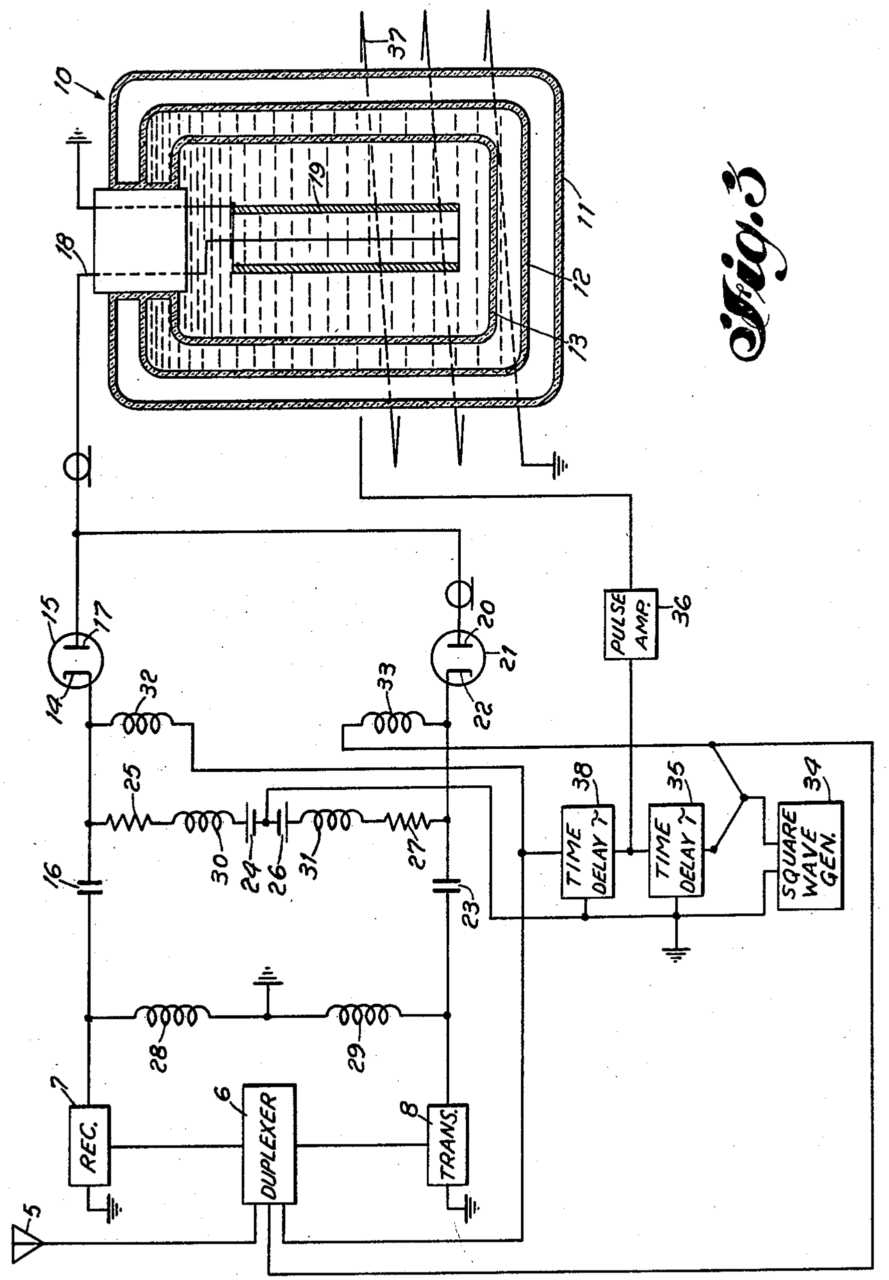
Fig. 3 is a block diagram and schematic of another embodiment of this invention.

Referring to Fig. 3, there is shown a receiver 7, a transmitter 8 and a duplexer 6 coupling the receiver 7 and the transmitter 8 to the antenna 5. The output of the receiver 7 is coupled to a cathode 14 of a first diode 15 by capacitor 16. Anode 17 of diode 15 is connected to the inner-conductor 18 of a delay line 19 enclosed within the cryostat 10 of the same construction as described above. The delay line 19 is of the reflection type; that is, it has a non-terminated end and may be a coaxial transmission line or other structure as may be desired. The inner-conductor 18 of delay line 19 is also connected to the anode 20 of a second diode 21. The cathode 22 of the diode 21 is coupled to the transmitter 8 by capacitor 23. Energy source 24 such as a battery, provides a positive bias to the cathode 14 of diode 15 through resistor 25. A second battery 26 provides a positive bias to the cathode 22 of diode 21 through resistor 27. Chokes 28, 29, 30, 31, 32 and 33 are chokes which offer a high impedance to RF. A square wave generator 34 produces a negative D.C. pulse output of period T and pulse width $\tau$. A portion of the output of the delay circuit 35 is coupled to a pulse amplifier 36 which amplifies the delayed pulse to sufficient magnitude to energize a magnetizing coil 37 wound around the cryostat 10. The delayed pulse output of delay circuit 35 is fed also to a second time delay circuit 38 having a delay time $\tau$. A portion of the pulse output of delay circuit 38 is coupled to the cathode 14 of diode 15 by choke 32. Another portion of the output of delay circuit 38 is fed to the duplexer 6 as is a part of the output of the undelayed pulse output of generator 34.

Figure 4:
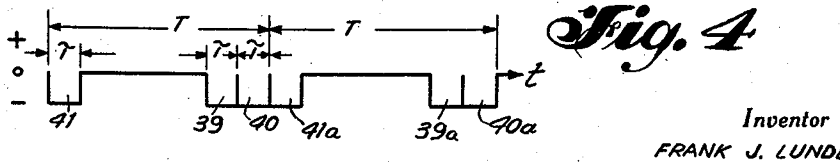
Fig. 4 is a graphical representation of a square wave generated pulse.

The operation of the circuit is as follows. At every interval of time T the square wave generator 34 generates a negative D.C. pulse 39 of which $\tau$ as shown in Fig. 4. This pulse is fed directly to the cathode 22 of diode 21 through choke 33. This negative voltage is sufficient to overcome the positive bias of battery 26 which has caused diode 21 to be non-conducting and to convert the diode 21 to the conducting state during the time $\tau$. This same pulse 39 is fed to the duplexer 6 to permit the transmitter 8 to transmit through the antenna 5. At the end of time $\tau$ the negative voltage disappears and diode 21 again becomes non-conducting. The delayed pulse output 40 of delay circuit 35 will energize the magnetizing coil 37 during the time $\tau$ immediately after the undelayed pulse 39 has disappeared from the cathode 22. The delayed pulse output 41 of delay circuit 38 will be operative immediately after the delayed pulse 40 has vanished and will overcome the positive bias on the cathode 14 of diode 15 to cause diode 15 to become conducting. The same pulse 41 will energize the duplexer to receive radar pulses from the antenna 5. When diode 15 is conducting the receiver will send radar pulses through diode 15 into the delay line 19. When diode 15 becomes non-conducting, diode 21 is also non-conducting and coil 37 is non-energized. Thus for the time $T-3\tau$ the radar pulse transmitted to the delay line 19 will pass back and forth thereon because of the non-termination of the delay line 19. At the end of time T a new undelayed pulse is generated by the square wave generator 34 which biases diode 21 to conduct and thereby allows the reflected radar pulses in the line 19 to pass through diode 21 to the transmitter 8 and from thence to the antenna 5 through the duplexer 6 which has been activated to transmit by the pulse 39. At the termination of the undelayed pulse 39, the delayed pulse 40 energizes the coil 37 to produce a magnetic field which restores the normal resistance of the delay line 19 thereby attenuating any residual pulses that may be present thereon and clearing the delay line 19 for the reception of a new radar pulse from the receiver 7.

While I have described above the principles of my invention in connection with specific embodiments, it is to be clearly understood that this description is made only by way of example and not as a limitation to the scope of my invention.

I claim:

1. A delay line of extremely low attenuation comprising conductors arranged in parallel relation to provide distributed inductance and capacitance therealong to effect a delay characteristic to signal energy transmitted therealong, the conductors of said line being of superconductive material, means to maintain said line at a temperature below the superconductivity transition temperature of said conductors to reduce the attenuation thereof to a minimum value, means to apply electrical signals to said delay line and outlet means for said signals delayed by said line.

2. A device for receiving electrical signals and retransmitting said signals delayed by a given time interval, comprising a receiver to receive electrical signals, a delay line of low attenuation comprising conductors arranged to provide distributed inductance and capacitance to delay signals propagated therealong by said given time interval, the conductors of said line being of superconductive material, means to maintain said line at a temperature below the superconductivity transition temperature of said conductors to reduce the attenuation thereof to a minimum value, means to apply electrical signals from said receiver to said delay line, a transmitter, and means to apply output signals from said line to said transmitter.

3. A device according to claim 2, wherein the delay line is of the reflection type whereby signals applied thereto are reflected between the ends thereof, and the means for applying signals to and from said line include switch means for first coupling said receiver to said delay line and after a predetermined interval of time to couple said line to said transmitter.

4. A device according to claim 3 further including means controlled by said switching means to apply a magnetic field to said delay line after transmission of the delayed signal to shift the superconductivity transition of said conductors to thereby increase the attenuation of the conductors to attenuate any residual energy of said signal remaining in said line.

References Cited in the file of this patent

UNITED STATES PATENTS 2,725,474 Ericsson et al. ---------- Nov. 29, 1955